(12) United States Patent
Chen et al.

(10) Patent No.: US 7,027,306 B2
(45) Date of Patent: Apr. 11, 2006

(54) MOUNTING APPARATUS FOR MOTHERBOARD

(75) Inventors: Yun Lung Chen, Tu-Chen (TW); Zhou Xu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/839,871

(22) Filed: May 5, 2004

(65) Prior Publication Data

US 2004/0223307 A1    Nov. 11, 2004

(30) Foreign Application Priority Data

May 5, 2003    (TW) ............................... 92208187 U

(51) Int. Cl.
*H05K 5/03*    (2006.01)

(52) U.S. Cl. ................... 361/725; 361/801; 312/265.6; 211/41.17

(58) Field of Classification Search ........ 361/679–687, 361/724–727, 796, 785, 801; 312/265.6, 312/265.5; 211/41.17
See application file for complete search history.

(56) References Cited

U.S. PATENT DOCUMENTS

| 5,145,243 | A   |   | 9/1992  | Liu |            |
|-----------|-----|---|---------|-----|------------|
| 6,097,591 | A   | * | 8/2000  | Ircha | ......................... 361/683 |
| 6,813,165 | B1  | * | 11/2004 | Cheng et al. | ............... 361/801 |
| 6,870,731 | B1  | * | 3/2005  | Lin et al. | .................... 361/683 |

FOREIGN PATENT DOCUMENTS

CN        00201452.1        12/2000

* cited by examiner

*Primary Examiner*—Hung Van Duong
(74) *Attorney, Agent, or Firm*—Wei Te Chung

(57) ABSTRACT

A mounting apparatus for a motherboard (10) providing a plurality of apertures (14) includes a panel (20), a support plate (40) attached to the panel and a fastener (50) for fastening the motherboard to the support plate. The panel includes a plurality of catches (21) and a pair of stoppers (23). The support plate includes a plurality of latches (44) and a fixing hole (46) corresponding the apertures of the motherboard respectively, and a plurality of catch openings (43) for engagingly receiving the catches of the panel to secure the support plate to the panel. The latches are configured to allow the motherboard be slid from a first position to a second position in which the motherboard is engaged with the latches. The fastener fastens the motherboard to the support plate at the second postion. The motherboard is thus secured to the panel of the chassis.

16 Claims, 3 Drawing Sheets

MOUNTING APPARATUS FOR MOTHERBOARD

BACKGROUND OF THE INVENTION

1. Field of the Invention

The present invention relates to mounting apparatuses for mounting computer components within a computer chassis, and particularly to a mounting apparatus for readily installing and removing a motherboard in and from a computer chassis.

2. Related Art

A number of different means and apparatus can be used to mount a motherboard to a computer chassis. One widely used means is to integrally form a computer chassis having a support plate from a sheet of metal. A motherboard is then attached to the support plate by a plurality of screws. A significant drawback of this means is that the insertion and removal of screws is cumbersome and time consuming, particularly given that a typical computer chassis has limited working space and accessibility. In addition, a tool such as a screwdriver is usually required. Moreover, the motherboard is prone to be damaged if the tool slips during manipulation of the screws.

More recent developments have yielded other means for facilitating installation and removal of a motherboard. These include the use of removable support plates. For example, U.S. Pat. No. 5,145,243 discloses a mounting apparatus that does not require screws to secure a support plate to a computer chassis. The apparatus makes assembly of the support plate into the chassis simple, but at the expense of having the substantial additional components and complex configuration of the fastening structure itself.

Moreover, an example of attachment of a motherboard to such a removable support plate is shown in China Pat. No. 00201452.1. The motherboard defines a plurality of holes therein. The support plate comprises a plurality of protruding portions corresponding to the holes of the motherboard, and each protruding portion defines an opening thereof. Screws extend through the holes of the motherboard and the openings of the support plate and screw the motherboard to the support plate. The using of the plurality of screws still will cause time consuming and cumbersome during the attachment and removing procedure.

Thus, a mounting apparatus for a motherboard which solves the above-mentioned problems is strongly desired.

SUMMARY OF THE INVENTION

Accordingly, an object of the present invention is to provide a mounting apparatus with a simple structure which readily allows attachment and removal of a motherboard to and from a chassis.

To achieve the above-mentioned object, a mounting apparatus in accordace with a preferred embodiment of the present invention is adapted to mount a motherboard providing a plurality of apertures in a computer chassis. The mounting apparatus comprises a panel, a support plate removably attached to the panel and a fastener for fastening the motherboard to the support plate. The panel comprises a plurality catches arranged in a predetermined locations and a pair of stoppers formed therefrom for securing the motherboard in a first direction. The support plate comprises a plurality of latches for engaging in some of the apertures of the motherboard, a fixing hole corresponding to one of the apertures of the motherboard, and a plurality of catch openings for engagingly receiving the catches of the panel_to secure the support plate to the panel. The latches are configured to allow the motherboard be slid from a first position to a second position in which the motherboard is engaged with the latches. The fastener is extended through the corresponding aperture of the motherboard and the fixing hole of the support plate at the second position and is fastened therein, thereupon the motherboard is attached to the support plate. The motherboard is thus secured to the panel. In this invention, it requires only one fastener to firmly attach the motherboard to the removable support plate, whereupon simplifies the attachment and removing procedure.

Other objects, advantages and novel features of the present invention will be drawn from the following detailed description of a preferred embodiment of the present invention with attached drawings, in which:

DESCRIPTION OF THE PREFERRED EMBODIMENT

Figures 1, 2, 3, 4:
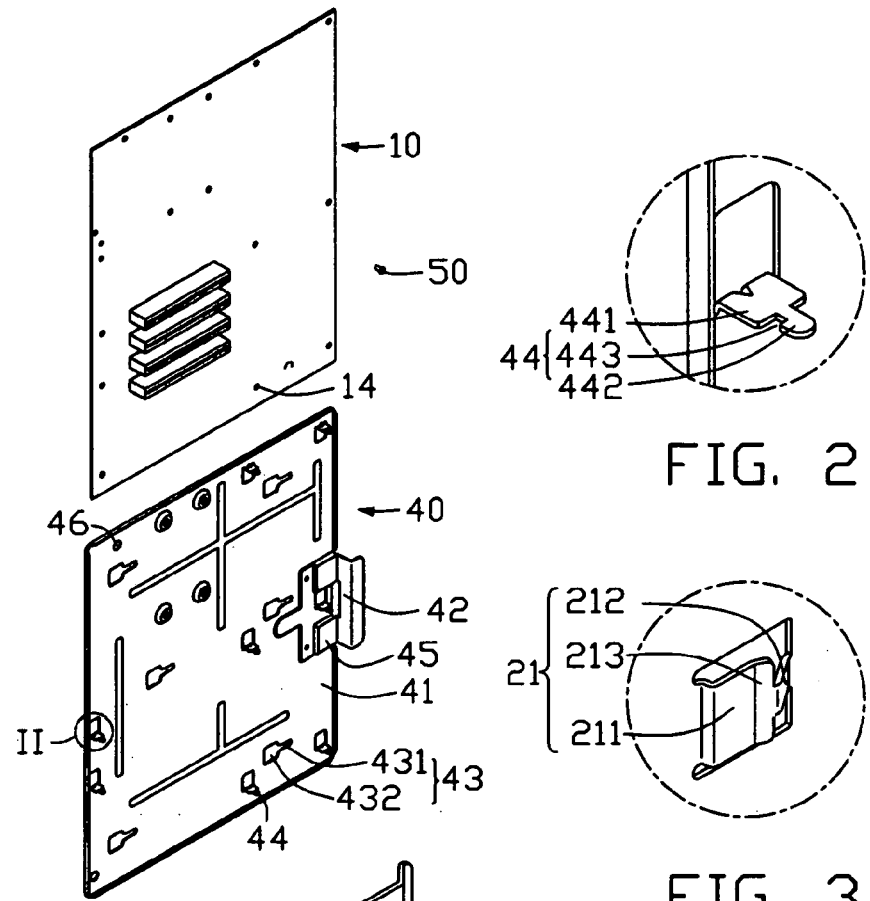
FIG. 1 is an exploded, isometric view of a mounting apparatus in accordance with the present invention, together with a motherboard.
FIG. 2 is an enlarged view of a circled portion II of FIG. 1.
FIG. 3 an enlarged view of a circled portion III of FIG. 1.
FIG. 4 is an enlarged view of a circled portion IV of FIG. 1.
Figure 5:
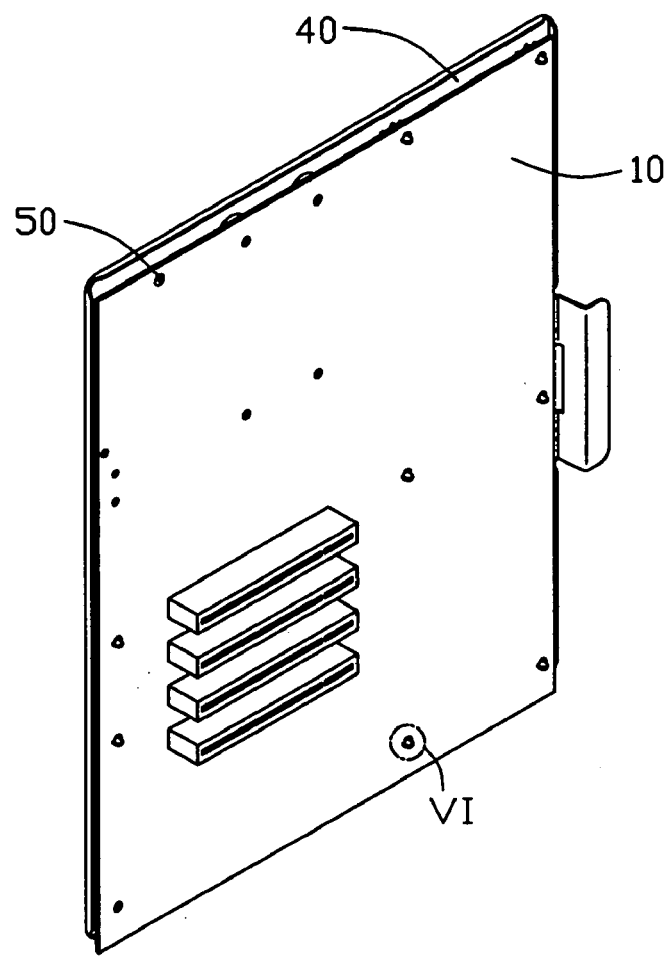
FIG. 5 is an assembled view of the motherboard and a support plate of the mounting apparatus of FIG. 1.
Figure 6:
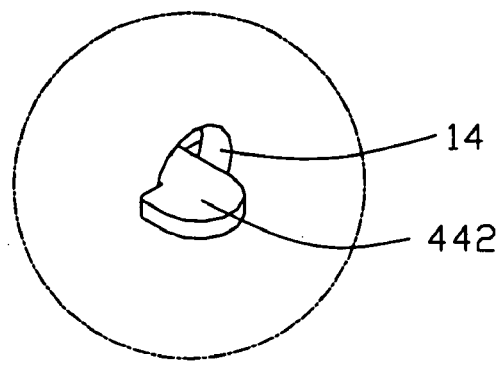
FIG. 6 an enlarged view of a circled portion VI of FIG. 5.
Figure 7:
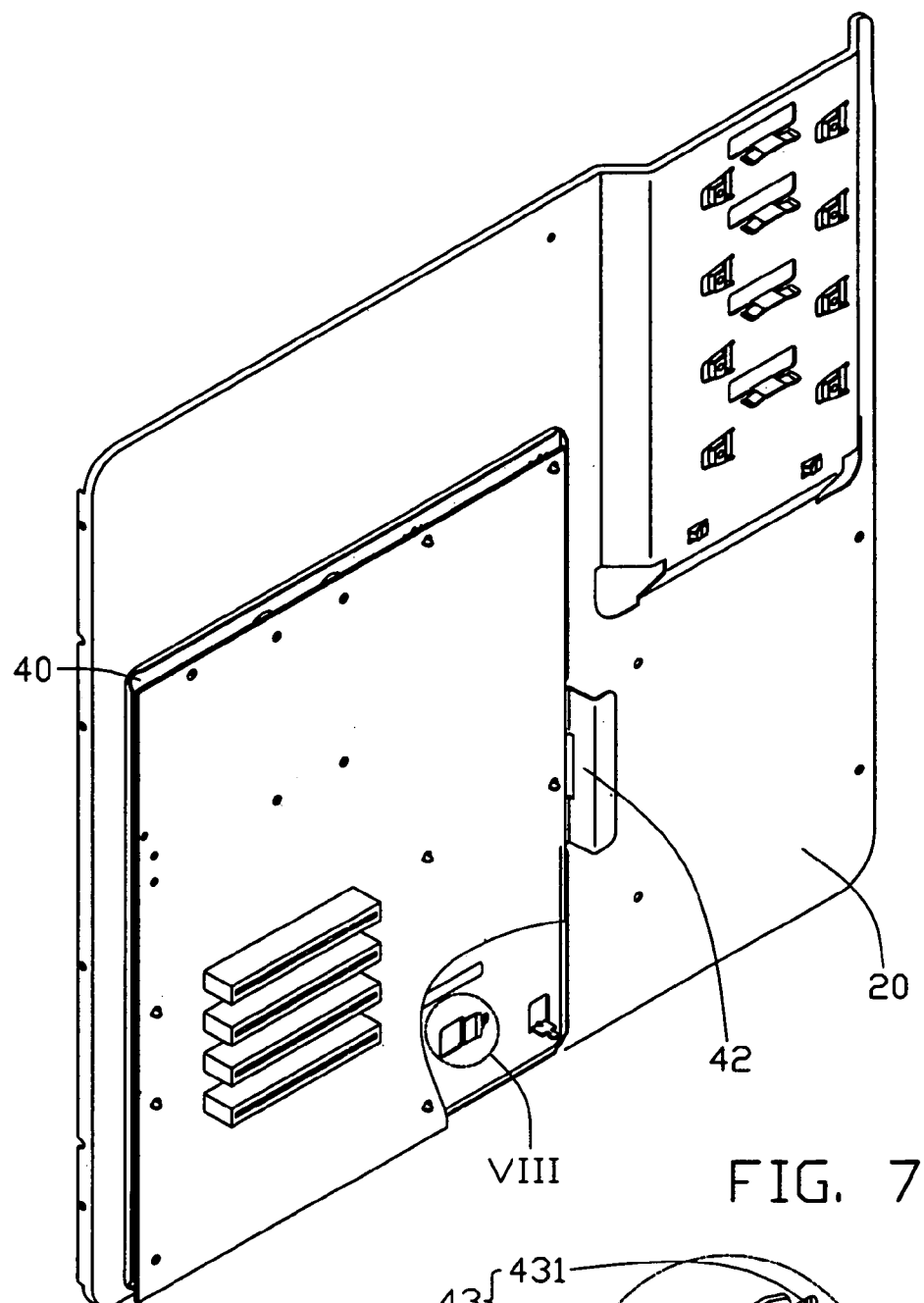
FIG. 7 is an assembled view of FIG. 1, with part of the motherboard cut away.
Figure 8:
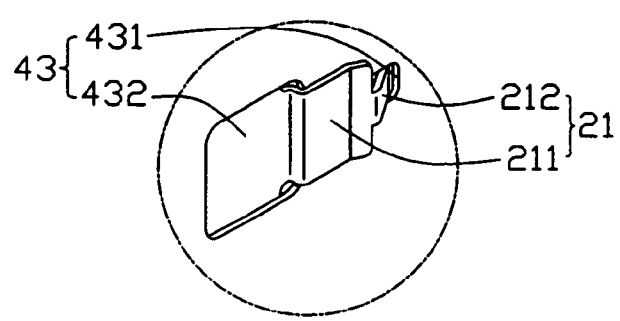
FIG. 8 an enlarged view of a circled portion VIII of FIG. 7.

Referring to FIGS. 1–4, a mounting appartus for a motherboard 10 in accordance with the preferred embodiment of the present invention comprises a side panel 20, a support panel 40, and a fastener 50 for fastening the motherboard 10 to the support panel 40.

The motherboard 10 defines a plurality of apertures 14 therein.

In the preferred embodiment, the side panel 20 is a part of a computer chassis (not shown). The side panel 20 comprises six catches 21 and two stoppers 23 arranged in predetermined locations as described below and shown in FIG. 1. In alternative embodiments, the numbers and locations of the catches 21 and stoppers 23 may be varied. Each catch 21 is stamped from the side panel 20, and comprises an L-shaped main section 211 adjoining the side panel 20, a slanted guiding section 213 extending obliquely inwardly from a distal end of the main section 211, and a connecting arm 212 extending obliquely outwardly from a distal end of the guiding section 213 and adjoining the side panel 20. Each stopper 23 is stamped from the side panel 20 such that it has a generally semi-conical shape, with the stopper 23 comprising an arcuate engaging edge 231. Each stopper 23 may alternatively have another appropriate configuration, such as in the form of a tab, a pin, etc.

The support panel 40 comprise a base plate 41, and a generally L-shaped handle 42 extending from an edge of the base plate 41. The base plate 41 comprises a plurality of latches 44 corresponding to some of the apertures 14 of the motherboard 10, a fixing hole 46 corresponding to one of the apertures 14 of the motherboard 10, and a plurality of catch openings 43 for engagingly receiving the catches 21 of the side panel 20.

Each latch 44 comprises a rectangular support section 441 extending perpendicularly from the base plate 41, and an end section 442 extending coplanarly from a distal end of the support section 441. The end section 442 defines a cutout 443 therein, the cutout 443 being adjacent the support section 441. The cutout 443 is configured so that part of the motherboard 10 at a corresponding aperture 14 can be slidingly engaged therein.

Each catch opening 43 comprises a narrow opening 431, and a wide opening 432 communicating with the narrow opening 431.

An edge portion of the base plate 41 at the handle 42 is stamped inwardly to form two coplanar bulges 45. The bulges 45 correspond to the stoppers 23 of the side panel 20, and allow the support plate 40 to be slidingly installed in position on the side panel 20. A displacement of the bulges 45 from the base plate 41 is less than a corresponding width of each of the stoppers 23, so that the stoppers 23 can secure the support panel 40 in a first direction that is parallel to the support panel 40. Furthermore, said displacement of the bulges 45 can be configured to be the same as a corresponding length of the support section 441 of each of the latches 44. In such case, the bulges 45 can facilitate supporting of the motherboard 10 on the support panel 40.

In the preferred embodiment of the present invention, the fastener 50 is a screw. In alternative embodiments, the fastener 50 may be a clip, a pin, etc.

In assembly, the end sections 442 of the latches 44 are received through corresponding apertures 14 of the motherboard 10, with corresponding parts of the motherboard 10 abutting the support sections 441 of the latches 44. In this position, the fixing hole 46 of the support panel 40 is not in alignment with its corresponding aperture 14 of the motherboard 10. Then, the motherboard 10 is slid in the first direction. Parts of the motherboard 10 at the corresponding apertures 14 are thus slidingly engaged in the cutouts 443, and the fixing hole 46 is aligned with its corresponding aperture 14 of the motherboard 10. The fastener 50 is extended through said corresponding aperture 14 and the fixing hole 46 and is fastened therein. The motherboard 10 is thus securely attached to the support plate 40.

Then, the combined motherboard 10 and support panel 40 is attached to the side panel 20. The catches 21 of the side panel 20 are received through the wide openings 432 of the support panel 40. The support panel 40 is slid in a second direction parallel to the side panel 20, the second direction being opposite to the first direction. The connecting arms 212 of the catches 21 are received in the narrow openings 431 of the support panel 40. The bulges 45 deformably ride over the stoppers 23 until a base portion of the handle 42 snappingly abuts the engaging edges 231 of the stoppers 23. In this position, root portions of the main sections 211 of the catches 21 abut corresponding shoulder edges of the support panel 40 at junctions of the narrow and wide openings 431, 432. Main portions of the main sections 211 of the catches 21 resiliently press on an inside face of the support panel 40, and the connecting arms 212 of the catches 21 abut corresponding edges of the support panel 40 at ends of the narrow openings 212. The combined motherboard 10 and support panel 40 is thus securely attached to the side panel 20.

In disassambly, the handle 42 is pulled slightly inwardly so that it is released from the stoppers 23. The handle 42 is then pulled so that the combined motherboard 10 and support panel 40 slides in the first direction. The catches 21 disengage from the support panel 40 at the catch openings 43, and the bulges 45 move free from the stoppers 23. The combined motherboard 10 and support panel 40 is then easily removed from the side panel 20.

The fastener 50 is unfastened, and the motherboard 10 is slidingly released from the cutouts 443. The motherboard 10 is then easily lifted away from the support panel 40.

It is understood that the invention may be embodied in other forms without departing from the spirit thereof. Thus, the present example and embodiment is to be considered in all respects as illustrative and not restrictive, and the invention is not to be limited to the details given herein.

What is claimed:

1. A mounting apparatus for a motherboard defining a plurality of apertures, the mounting apparatus comprising:
   a panel comprising a plurality catches, and at least one stopper for securing the motherboard in a first direction;
   a support plate removably attached to the panel, comprising a base plate which has a plurality of latches for engaging in some of the apertures of the motherboard, a fixing hole corresponding to one of the apertures of the motherboard, and a plurality of catch openings for engagingly receiving the catches of the panel, the latches being configured to allow the motherboard to be slid from a first position to a second position in which the motherboard is engaged with the latches; and
   a fastener extending through a corresponding aperture of the motherboard and the fixing hole of the support plate and fastening the motherboard to the support plate in the second position.

2. The mounting apparatus as described in claim 1, wherein the catches each comprises an L-shaped main section extending form the panel, a slanted guiding section extending obliquely form a distal end of the main section, and a connecting and extending obliquely from a distal end of the guiding section and connecting with the panel.

3. The mounting apparatus as described in claim 1, wherein the catch openings each comprises a narrow opening and a wide opening communicating with the narrow opening.

4. The mounting apparatus as described in claim 1, wherein the at least one stopper is stamped from the panel to form a generally semi-conical shape, the at least one stopper having an arcuate engaging edge.

5. The mounting apparatus as described in claim 1, wherein an edge of the base plate is stamped to form at least one bulge corresponding to the at least one stopper of the panel, and a displacement of the bulge from the base plate is less than a width of the at least one stopper for securing the supporting panel in the first direction.

6. The mounting appartus as described in claim 1, wherein the support plate further comprises a generally L-shaped handle extending from an edge of the base plate.

7. The mounting apparatus as described in claim 1, wherein the latches each comprises a rectangular support section extending from the base plate, and an end section extending from a distal end of the support section, and the end section defines a cutout therein adjacent the support section.

8. A mounting apparatus for a motherboard, comprising:
   a panel comprising a plurality of catches and at least one stopper, and
   a support plate adapted to position the motherboard, comprising a base plate and a handle extending from an end of the base plate, the base plate defining a plurality of catch opening, for engagingly receiving the catches of the panel; wherein an end of the base plate stamped inwardly to form at least one bulge corresponding to the at least one stopper of the panel, and a displacement of the bulge from the panel being less than a width of the at least one stopper, for securing the support panel in the first direction.

9. The mounting apparatus as described in claim 8, wherein the catches each comprises a generally L-shaped main section extending from the panel, a slanted guiding section extending obliquely form a distal end of the main section, and a connecting arm extending obliquely from a distal end of the guiding section and connecting with the panel.

10. The mounting apparatus as described in claim 8, wherein the at least one stopper is stamped from the panel to form a generally semi-conical shape, the at least one stopper having an arcuate engaging edge.

11. The mounting apparatus as described in claim 8, wherein the base plate comprise a latch with a support section, and the displacement of the bulge is the same as a corresponding length of the support section of the latch.

12. The mounting apparatus as described in claim 9, wherein the catch openings each comprises a narrow opening for receiving the connecting aria of a corresponding, catch, and a wide opening communicating with the narrow opening.

13. A mounting apparatus assembly comprising:
a motherboard defining a plurality of apertures;
a support plate adapted to be attached to a chassis, comprising a base plate forming a plurality of latches for engaging in corresponding apertures of the motherboard, and a fixing hole being offset from a corresponding aperture of the motherboard when the motherboard is at a first position; and
a fastener extending through the fixing hole of the support plate and the corresponding aperture of the motherboard when the motherboard is at a second position in which the fixing hole is in alignment with the corresponding aperture, the fastener fastening the motherboard to the support plate.

14. The mounting apparatus as described in claim 13, wherein the support plate further comprises a generally L-shaped handle extending from an end of the base plate.

15. The mounting apparatus as described in claim 13, wherein the latches each comprises a rectangular support section extending from the base plate, and an end section extending from a distal end of the support section, and the end section defines a cutout therein adjacent the support section.

16. The mounting apparatus as described in claim 15, wherein the cutout is configured so that the motherboard can be slid between the first position and the second position.

* * * * *